US011804508B2

(12) United States Patent
Cai

(10) Patent No.: US 11,804,508 B2
(45) Date of Patent: Oct. 31, 2023

(54) SENSOR, MANUFACTURING METHOD THEREOF, AND PHOTOELECTRIC CONVERSION DEVICE

(71) Applicant: TCL CHINA STAR OPTOELECTRONICS TECHNOLOGY CO., LTD., Shenzhen (CN)

(72) Inventor: Guangshuo Cai, Shenzhen (CN)

( * ) Notice: Subject to any disclaimer, the term of this patent is extended or adjusted under 35 U.S.C. 154(b) by 417 days.

(21) Appl. No.: 16/982,596

(22) PCT Filed: May 15, 2020

(86) PCT No.: PCT/CN2020/090568
§ 371 (c)(1),
(2) Date: Sep. 21, 2020

(87) PCT Pub. No.: WO2021/217739
PCT Pub. Date: Nov. 4, 2021

(65) Prior Publication Data
US 2023/0107514 A1    Apr. 6, 2023

(30) Foreign Application Priority Data
Apr. 29, 2020  (CN) .......................... 202010353819.1

(51) Int. Cl.
*H01L 27/146* (2006.01)
*G01T 1/20* (2006.01)

(52) U.S. Cl.
CPC ...... *H01L 27/14663* (2013.01); *G01T 1/2018* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 2010/0140622 A1 | 6/2010 | Lee et al. | |
| 2018/0143331 A1 | 5/2018 | Maeda et al. | |
| 2019/0187300 A1* | 6/2019 | Kim | ........................ G01T 1/208 |

FOREIGN PATENT DOCUMENTS

| | | |
|---|---|---|
| CN | 102683364 A | 9/2012 |
| CN | 104393024 A | 3/2015 |
| CN | 209607741 U | 11/2019 |
| CN | 110676270 A | 1/2020 |
| CN | 110729309 A | 1/2020 |
| JP | 2013157608 A | 8/2013 |

(Continued)

OTHER PUBLICATIONS

International Search Report in International application No. PCT/CN2020/090568,dated Jan. 27, 2021.

(Continued)

*Primary Examiner* — Edwin C Gunberg

(57) ABSTRACT

A sensor, a manufacturing method thereof, and a photoelectric conversion device are provided. The sensor includes a first gate disposed on a second insulating layer, wherein a position of the first gate corresponds to a position of a first active layer and a material of the first gate is a metal material; a second gate disposed on the second insulating layer or between a second active layer and a base substrate, wherein a position of the second active layer corresponds to a position of the second gate.

20 Claims, 3 Drawing Sheets

(56) References Cited

FOREIGN PATENT DOCUMENTS

WO    2019181558 A1    9/2019

OTHER PUBLICATIONS

Written Opinion of the International Search Authority in International application No. PCT/CN2020/090568, dated Jan. 27, 2021.
Chinese Office Action issued in corresponding Chinese Patent Application No. 202010353819.1 dated Jan. 3, 2023, pp. 1-6.

* cited by examiner

SENSOR, MANUFACTURING METHOD THEREOF, AND PHOTOELECTRIC CONVERSION DEVICE

FIELD OF INVENTION

The present invention relates to the field of display technologies, and in particular, to a sensor, a manufacturing method thereof, and a photoelectric conversion device.

BACKGROUND OF INVENTION

Compared with passive pixel sensors, active pixel sensors have received widespread attention because of their higher signal-to-noise ratio. Traditional active pixel sensors are generally divided into two types: direct and indirect. Among them, the indirect active pixel sensors have advantages of low operating voltage, high scanning speed, low radiation dose, and low quantum noise.

As shown in FIG. 1, a general indirect active pixel sensor consists of a thin film transistor 11 (TFT), a photodiode 12, and a scintillator layer 13. The scintillator layer 13 first absorbs X-rays to generate visible light, and then the photodiode 12 converts a light signal into an electrical signal (a direction of light is shown by an arrow in FIG. 1), and then a progressive scan of an image is achieved through the thin film transistor 11.

This structure usually requires p-type materials and n-type materials to form a p-i-n photodiode. In order to obtain a larger photocurrent, the photodiode needs a larger light receiving area, that is, an area of the photodiode is larger, thereby increasing a size of the sensor.

Therefore, it is necessary to provide a sensor, a manufacturing method thereof, and a photoelectric conversion device to solve problems existing in the prior art.

Technical Solution

An objective of the present invention is to provide a sensor, a manufacturing method thereof, and a photoelectric conversion device, which can reduce a size of the sensor.

In order to solve the above technical problems, the present invention provides a sensor comprising:

a base substrate;

a first active layer and a second active layer disposed on the base substrate;

a first source and a first drain disposed on a part of the first active layer;

a second source and a second drain disposed on a part of the second active layer, wherein the second source is connected to the first drain;

a second insulating layer disposed on the first source, the first drain, the second source, and the second drain;

a first gate disposed on the second insulating layer, wherein a position of the first gate corresponds to a position of the first active layer, and a material of the first gate is a metal material;

a second gate disposed on the second insulating layer or between the second active layer and the base substrate, wherein a position of the second active layer corresponds to a position of the second gate, and when the second gate is disposed on the second insulating layer, a material of the second gate is a transparent conductive material; and a scintillator layer disposed on the first gate and the second insulating layer.

The present invention further provides a photoelectric conversion device, comprising the above-mentioned sensor.

The present invention further provides a manufacturing method of a sensor, comprising following steps:

forming a second gate on a base substrate;

forming a first insulating layer on the second gate;

forming a first active layer on the first insulating layer and forming a second active layer on the first insulating layer corresponding to the second gate;

forming a first source and a first drain on the first active layer, and forming a second source and a second drain on the second active layer, wherein the second source is connected to the first drain;

forming a second insulating layer on the first source, the first drain, the second source, and the second drain;

forming a first gate on the second insulating layer corresponding to the first active layer; and forming a scintillator layer on the first gate and the second insulating layer.

The sensor, manufacturing method thereof, and photoelectric conversion device of the present invention comprise a base substrate; a first active layer and a second active layer disposed on the base substrate; a first source and a first drain disposed on a part of the first active layer; a second source and a second drain disposed on a part of the second active layer, wherein the second source is connected to the first drain; a second insulating layer disposed on the first source, the first drain, the second source, and the second drain; a first gate disposed on the second insulating layer, wherein a position of the first gate corresponds to a position of the first active layer, and a material of the first gate is a metal material; a second gate disposed on the second insulating layer or between the second active layer and the base substrate, wherein a position of the second active layer corresponds to a position of the second gate, and when the second gate is disposed on the second insulating layer, a material of the second gate is a transparent conductive material; and a scintillator layer disposed on the first gate and the second insulating layer or disposed on the first gate, the second gate, and the second insulating layer. Because a photoelectric thin film transistor is used to replace a photodiode and the photoelectric thin film transistor has a higher quantum efficiency, a large light-receiving area is not required, thus reducing the size of the sensor.

DETAILED DESCRIPTION OF PREFERRED EMBODIMENTS

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

Figure 2:
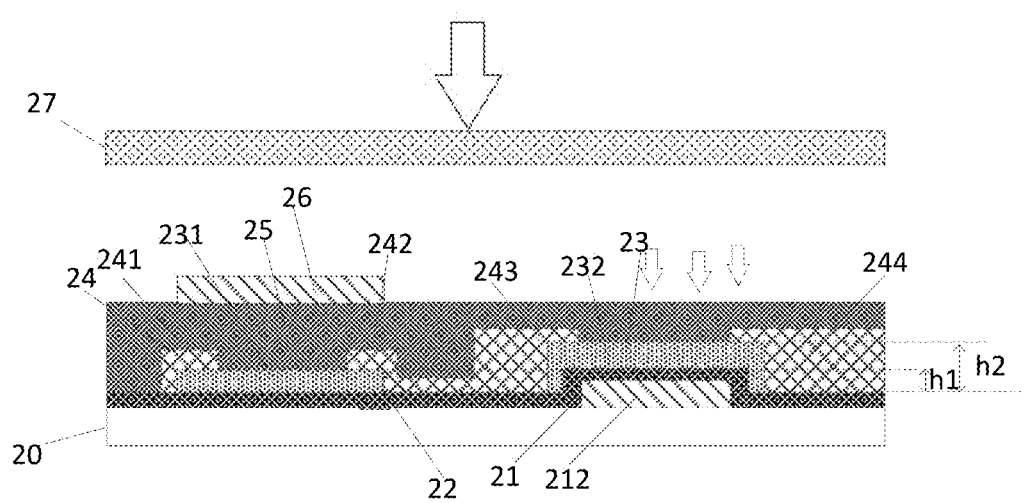
FIG. 2 is a schematic structural view of a sensor according to an embodiment of the present invention.

Please refer to FIG. 2, which is a schematic structural view of a sensor according to an embodiment of the present invention.

The sensor of the embodiment is an X-ray imaging sensor or an X-ray detector. As shown in FIG. 2, in an embodiment, the sensor of the present invention comprises a base substrate 20, a second gate 212, a first insulating layer 22, a first active layer 231, a second active layer 232, a first source 241, a first drain 242, a second source 243, a second drain 244, a first gate 26, and a scintillator layer 27.

A material of the base substrate 20 comprises at least one of glass, polyethylene naphthalate, polyethylene terephthalate (PET), or polyimide (PI).

The second gate 212 is disposed on the base substrate 20. A material of the second gate 212 may be a transparent conductive material or a metal material.

The first insulating layer 22 is disposed on the second gate 212 and the base substrate 20.

The first active layer 231 and the second active layer 232 are both disposed on the first insulating layer 22. A position of the second active layer 232 corresponds to a position of the second gate 212. In an embodiment, in order to simplify a manufacturing process and reduce production costs, the first active layer 231 and the second active layer 232 are arranged in a same layer and have a same material. A material of the first active layer 231 comprises at least one of metal oxide, amorphous silicon, or polysilicon.

In an embodiment, in order to further improve a quantum efficiency of a second thin film transistor, a thickness h2 of the second active layer 232 is greater than or equal to a thickness h1 of the first active layer 231. A material of the second active layer 232 comprises at least one of metal oxide, amorphous silicon, or polysilicon. In other embodiments, the thickness of the second active layer 232 may also be equal to the thickness of the first active layer 231.

The first source 241 and the first drain 242 are both disposed on a part of the first active layer 231. A thickness of the first source 241 is equal to or approximately equal to a thickness of the first drain 242. That is, the first source 241 and the first drain 242 are respectively connected to one of two ends of the first active layer 231. The first source 241 and the first drain 242 are made of a same material. A material of the first source 241 may be a metal material or a transparent conductive material, but the material of the first source is not limited thereto.

The second source 243 and the second drain 244 are both disposed on a part of the second active layer 232. The second source 243 is connected to the first drain 242. That is, the first source 241 and the first drain 242 are respectively connected to one of the two ends of the first active layer 231. A thickness of the second source 243 may be equal to or approximately equal to a thickness of the second drain 244. The second gate 212, the second active layer 232, the second source 243, and the second drain 244 constitute the second thin film transistor. The second thin film transistor is a photoelectric thin film transistor. Electrons in the second active layer are excited by light to generate electrical signals. In another embodiment, in order to simplify the manufacturing process, the first source 241, the first drain 242, the second source 243, and the second drain 244 are arranged in a same layer and have a same material. In an embodiment, in order to further improve the quantum efficiency of the second thin film transistor, a material of the second source 243 can be a transparent conductive material, so that a photosensitive area of the active layer can be increased. Of course, in other embodiments, the material of the second source 243 can also be a metal material. The material of the second source 243 is the same as a material of the second drain 244.

A second insulating layer 25 is disposed on the first source 241, the first drain 242, the second source 243, and the second drain 244. In order to further improve the quantum efficiency of the second thin film transistor, a material of the second insulating layer 25 is a transparent insulating material.

The first gate 26 is disposed on the second insulating layer 25. A position of the first active layer 231 corresponds to a position of the first gate 26. A material of the first gate 26 is a metal material. In order to improve a conductivity of a first thin film transistor, a material structure of the first gate 26 may comprise at least one of Cr, Al, Cr/Cu, Cr/Al, Mo/Cu, Mo/Al, Mo/Ti/Cu, or Mo/Ti/Al. The first gate 26, the first active layer 231, the first source 241, and the first drain 241 constitute the first thin film transistor.

The scintillator layer 27 is disposed on the first gate 26 and the second insulating layer 25. The scintillator layer 27 can absorb X-rays to generate visible light. In a specific use process, the scintillator layer 27 first absorbs X-rays to generate the visible light, and then the second thin film transistor converts a light signal into an electrical signal, and the first thin film transistor realizes a progressive scan of an image.

Because the photoelectric thin film transistor is used to replace the traditional photodiode, and the photoelectric thin film transistor has a higher quantum efficiency, there is no need for a large light receiving area, thereby reducing a size of the sensor. The first gate is used as a light-shielding layer, thus simplifying the manufacturing process and reducing the production costs. In addition, the first thin film transistor and the photoelectric thin film transistor share multiple yellow light processes, which not only reduces costs, but also increases productivity.

The present invention further provides a manufacturing method of the sensor. In an embodiment, the method comprises:

S101: Forming the second gate 212 on the base substrate.

In order to simplify the manufacturing process, in an embodiment, the first metal layer 21 is formed on the base substrate 20, and the first metal layer 21 is patterned to form the second gate 212. A material of the first metal layer 21 comprises at least one of a transparent conductive material, Mo, Cu, Al, or Ti. For example, indium tin oxide (ITO), Mo/Cu, Mo/Al, Al, Mo/Ti/Cu, Mo/Ti/Al and other conductive oxides, or metal laminates. The second gate 212 can be made by sputtering or evaporation process. The steps of patterning treatment comprise exposure, development, etching, etc.

S102: Forming the first insulating layer 22 on the second gate 212.

A material of the first insulating layer 22 may comprise, but is not limited to, aluminum oxide, silicon nitride, silicon dioxide, and aluminum nitride.

S103: Forming the first active layer 231 on the first insulating layer 22 and forming the second active layer 232 on the first insulating layer 22 corresponding to the second gate 212.

The material of the second active layer 232 is metal oxide.

In order to simplify the manufacturing process, in an embodiment, a semiconductor layer 23 is formed on the first insulating layer 22, and the semiconductor layer 23 is patterned to form the first active layer 231 and the second active layer 232.

The first active layer 231 and the second active layer 232 can be made by sputtering or chemical vapor deposition process.

S104: Forming the first source and the first drain on the first active layer, and forming the second source and the second drain on the second active layer.

Wherein the second source 243 is connected to the first drain 242.

In an embodiment, in order to simplify the manufacturing process, the second metal layer 24 may be formed on the first active layer 231 and the second active layer 232, and the second metal layer 24 may be patterned to form the first source 241, the first drain 242, the second source 243, and the second drain 244. A material of the second metal layer 24 comprises at least one of a transparent conductive material, Mo, Cu, Al, or Ti. The first source 241, the first drain 242, the second source 243, and the second drain 244 can be made by sputtering or evaporation process. Of course, in other embodiments, the first source 241, the first drain 242, the second source 243, and the second drain 244 can also be formed in different layers.

In addition, the above method may further comprise:

S105: Forming the second insulating layer 24 on the first source 241, the first drain 242, the second source 243, and the second drain 244.

The material of the second insulating layer 25 is preferably a transparent conductive material, and the material of the second insulating layer 25 comprises at least one of aluminum oxide, silicon nitride, silicon dioxide, or aluminum nitride. The second insulating layer 25 can be made by one of sputtering, chemical vapor deposition, atomic layer deposition, and plasma enhanced atomic layer.

S106: Forming the first gate on the second insulating layer corresponding to the first active layer.

For example, the first gate 26 is formed on the second insulating layer 25 corresponding to the first active layer 231, wherein the first gate 26 covers the first active layer 231. A manufacturing process of the first gate 26 is the same as that of the second gate 212.

In addition, the above method may further comprise:

S107: Forming the scintillator layer 27 on the first gate 26 and the second insulating layer 25.

For example, the scintillator layer 27 can be formed on the first gate 26 and the second insulating layer 25. Alternatively, a pre-prepared scintillator layer 27 can be attached to the first gate 26 and the second insulating layer 25.

Figure 3:
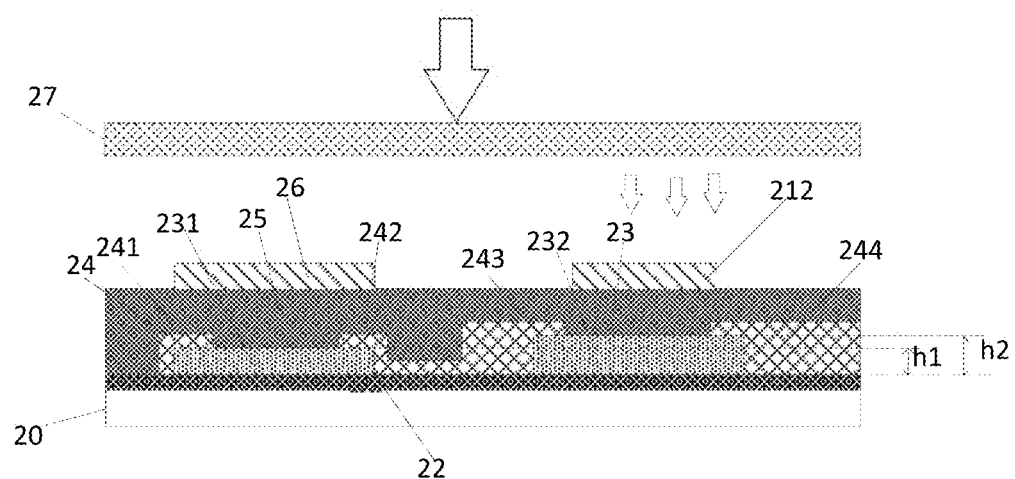
FIG. 3 is a schematic structural view of the sensor according to another embodiment of the present invention.

Please refer to FIG. 3, which is a schematic structural view of the sensor according to another embodiment of the present invention.

Figure 1:
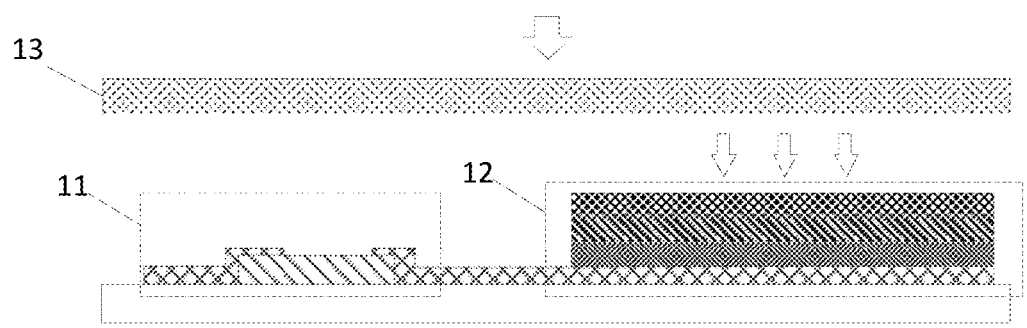
FIG. 1 is a schematic structural view of a current sensor.

A difference between the sensor of the embodiment and the previous embodiment is that the second gate 212 of the embodiment is also disposed on the second insulating layer 25, which can save the first insulating layer compared with the structure shown in FIG. 1.

The material of the second gate 212 in the embodiment is a transparent conductive material.

In addition, the scintillator layer 27 of the embodiment is disposed on the first gate 26, the second gate 212, and the second insulating layer 25.

The embodiment of the present invention provides a manufacturing method of the sensor. In an embodiment, the method comprises:

S201: Separately forming the first active layer 231 and the second active layer 232 on the base substrate.

S202: Forming the first source 241 and the first drain 242 on the first active layer 231, respectively, and forming the second source 243 and the second drain 244 on the second active layer 232.

Wherein the second source 243 is connected to the first drain 242.

S203: Forming the second insulating layer 25 on the first source 241, the first drain 242, the second source 243, and the second drain 244.

S204: Forming the first gate 26 on the second insulating layer 25 corresponding to the first active layer 231, and forming the second gate 212 on the second insulating layer 25 corresponding to the second active layer 232.

The material of the first gate 26 is a transparent conductive material. The material of the first gate 26 is different from the material of the second gate 212.

S205: Forming the scintillator layer 27 on the first gate 26, the second gate 212, and the second insulating layer 25. The above specific manufacturing process is the same as the previous embodiment.

The present invention further provides a photoelectric conversion device, which comprises any one of the above-mentioned sensors. In addition, it may also comprise a driving circuit for driving the sensor. Since the photoelectric conversion device uses a smaller sensor, a resolution of the photoelectric conversion device can be improved.

The sensor, manufacturing method thereof, and photoelectric conversion device of the present invention comprise a base substrate; a first active layer and a second active layer disposed on the base substrate; a first source and a first drain disposed on a part of the first active layer; a second source and a second drain disposed on a part of the second active layer, wherein the second source is connected to the first drain; a second insulating layer disposed on the first source, the first drain, the second source, and the second drain; a first gate disposed on the second insulating layer, wherein a position of the first gate corresponds to a position of the first active layer, and a material of the first gate is a metal material; a second gate disposed on the second insulating layer or between the second active layer and the base substrate, wherein a position of the second active layer corresponds to a position of the second gate, and when the second gate is disposed on the second insulating layer, a material of the second gate is a transparent conductive material; and a scintillator layer disposed on the first gate and the second insulating layer or disposed on the first gate, the second gate, and the second insulating layer. Because a photoelectric thin film transistor is used to replace a photodiode and the photoelectric thin film transistor has a higher quantum efficiency, a large light-receiving area is not required, thus reducing the size of the sensor.

In summary, although the present invention has been disclosed as above in preferred embodiments, the above-mentioned preferred embodiments are not intended to limit the present invention. Those of ordinary skill in the art can make various changes and modifications without departing from the spirit and scope of the present invention. Therefore, the protection scope of the present invention is subject to the scope defined by the claims.

What is claimed is:

1. A sensor, comprising:
a base substrate;
a first active layer and a second active layer disposed on the base substrate;
a first source and a first drain disposed on a part of the first active layer and in contact with the first active layer;
a second source and a second drain disposed on a part of the second active layer and in contact with the second active layer, wherein the second source is connected to the first drain;
a second insulating layer disposed on the first source, the first drain, the second source, and the second drain;
a first gate disposed on the second insulating layer, wherein a position of the first gate corresponds to a position of the first active layer, and a material of the first gate is a metal material;

a second gate disposed on the second insulating layer or between the second active layer and the base substrate, wherein a position of the second active layer corresponds to a position of the second gate, and when the second gate is disposed on the second insulating layer, a material of the second gate is a transparent conductive material; and a scintillator layer disposed on the first gate and the second insulating layer;

wherein a first thin film transistor comprises the first source, the first drain, the first gate and the first active layer; a second thin film transistor comprises the second gate, the second active layer, the second source, and the second drain, and the second thin film transistor is a photoelectric thin film transistor.

2. The sensor as claimed in claim 1, wherein when the second gate is between the second active layer and the base substrate, the sensor further comprises a first insulating layer, and the first insulating layer is disposed on the second gate and the base substrate.

3. The sensor as claimed in claim 1, wherein a material structure of the first gate comprises at least one of Cr, Al, Cr/Cu, Cr/Al, Mo/Cu, Mo/Al, Mo/Ti/Cu, or Mo/Ti/Al.

4. The sensor as claimed in claim 1, wherein a material of the second insulating layer is a transparent insulating material.

5. The sensor as claimed in claim 1, wherein the first source, the first drain, the second source, and the second drain are arranged in a same layer and have a same material.

6. The sensor as claimed in claim 5, wherein the material of the second source and the material of the second drain are transparent conductive materials.

7. The sensor as claimed in claim 1, wherein the first active layer and the second active layer are arranged in a same layer and have a same material, and a thickness of the second active layer is greater than a thickness of the first active layer.

8. The sensor as claimed in claim 1, wherein a material of the first active layer comprises at least one of polysilicon, amorphous silicon, or metal oxide.

9. A photoelectric conversion device, comprising a sensor, wherein the sensor comprises:
a base substrate;
a first active layer and a second active layer disposed on the base substrate;
a first source and a first drain disposed on a part of the first active layer and in contact with the first active layer;
a second source and a second drain disposed on a part of the second active layer and in contact with the second active layer, wherein the second source is connected to the first drain;
a second insulating layer disposed on the first source, the first drain, the second source, and the second drain;
a first gate disposed on the second insulating layer, wherein a position of the first gate corresponds to a position of the first active layer, and a material of the first gate is a metal material;
a second gate disposed on the second insulating layer or between the second active layer and the base substrate, wherein a position of the second active layer corresponds to a position of the second gate, and when the second gate is disposed on the second insulating layer, a material of the second gate is a transparent conductive material; and
a scintillator layer disposed on the first gate, and the second insulating layer;

wherein a first thin film transistor comprises the first source, the first drain, the first gate and the first active layer; a second thin film transistor comprises the second gate, the second active layer, the second source, and the second drain, and the second thin film transistor is a photoelectric thin film transistor.

10. The photoelectric conversion device as claimed in claim 9, wherein when the second gate is between the second active layer and the base substrate, the sensor further comprises a first insulating layer, and the first insulating layer is disposed on the second gate and the base substrate.

11. The photoelectric conversion device as claimed in claim 9, wherein a material structure of the first gate comprises at least one of Cr, Al, Cr/Cu, Cr/Al, Mo/Cu, Mo/Al, Mo/Ti/Cu, or Mo/Ti/Al.

12. The photoelectric conversion device as claimed in claim 9, wherein a material of the second insulating layer is a transparent insulating material.

13. The photoelectric conversion device as claimed in claim 9, wherein the first source, the first drain, the second source, and the second drain are arranged in a same layer and have a same material.

14. The photoelectric conversion device as claimed in claim 13, wherein the material of the second source and the material of the second drain are transparent conductive materials.

15. The photoelectric conversion device as claimed in claim 9, wherein the first active layer and the second active layer are arranged in a same layer and have a same material, and a thickness of the second active layer is greater than a thickness of the first active layer.

16. The photoelectric conversion device as claimed in claim 9, wherein a material of the first active layer comprises at least one of polysilicon, amorphous silicon, or metal oxide.

17. A manufacturing method of a sensor, comprising following steps:
forming a second gate on a base substrate;
forming a first insulating layer on the second gate;
forming a first active layer on the first insulating layer and forming a second active layer on the first insulating layer corresponding to the second gate;
forming a first source and a first drain on the first active layer and in contact with the first active layer, and forming a second source and a second drain on the second active layer and in contact with the second active layer, wherein the second source is connected to the first drain, a second thin film transistor comprises the second gate, the second active layer, the second source, and the second drain, and the second thin film transistor is a photoelectric thin film transistor;
forming a second insulating layer on the first source, the first drain, the second source, and the second drain;
forming a first gate on the second insulating layer corresponding to the first active layer, wherein a material of the first gate is a metal material, and a first thin film transistor comprises the first source, the first drain, the first gate and the first active layer; and
forming a scintillator layer on the first gate and the second insulating layer.

18. The manufacturing method of the sensor as claimed in claim 17, wherein a material structure of the first gate comprises at least one of Cr, Al, Cr/Cu, Cr/Al, Mo/Cu, Mo/Al, Mo/Ti/Cu, or Mo/Ti/Al.

19. The manufacturing method of the sensor as claimed in claim 17, wherein a material of the second insulating layer is a transparent insulating material.

20. The manufacturing method of the sensor as claimed in claim 17, wherein the step of forming a first active layer on the first insulating layer and forming a second active layer on the first insulating layer corresponding to the second gate comprises:

forming a first active layer and a second active layer arranged in a same layer and having a same material, wherein a material of the first active layer comprises at least one of polysilicon, amorphous silicon, or metal oxide, and a thickness of the second active layer is greater than a thickness of the first active layer.

\* \* \* \* \*